(12) United States Patent
Park et al.

(10) Patent No.: US 7,989,136 B2
(45) Date of Patent: Aug. 2, 2011

(54) PHOTORESIST COMPOSITION AND METHOD OF FORMING A PHOTORESIST PATTERN USING THE SAME

(75) Inventors: Jeong-Min Park, Seoul (KR); Doo-Hee Jung, Seoul (KR); Hi-Kuk Lee, Yongin-si (KR); Hyoc-Min Yoon, Hwaseong-si (KR); Ki-Hyuk Koo, Hwaseong-si (KR)

(73) Assignees: Samsung Electronics Co., Ltd. (KR); Dongjin Semichem Co., Ltd. (KR)

( * ) Notice: Subject to any disclaimer, the term of this patent is extended or adjusted under 35 U.S.C. 154(b) by 645 days.

(21) Appl. No.: 12/059,113

(22) Filed: Mar. 31, 2008

(65) Prior Publication Data
US 2009/0042127 A1 Feb. 12, 2009

(30) Foreign Application Priority Data
Apr. 2, 2007 (KR) .................. 10-2007-0032371

(51) Int. Cl.
*G03F 7/028* (2006.01)
*G03F 7/038* (2006.01)

(52) U.S. Cl. .............. 430/270.1; 430/322; 430/920; 430/922; 430/927

(58) Field of Classification Search ............... 430/270.1, 430/919, 920, 922, 925, 927, 322
See application file for complete search history.

(56) References Cited

U.S. PATENT DOCUMENTS

| 5,227,422 | A | * | 7/1993 | Mitsuji et al. | 524/457 |
| 5,529,885 | A | * | 6/1996 | Ochiai et al. | 430/270.1 |
| 5,609,988 | A | * | 3/1997 | Miyamoto et al. | 430/270.1 |
| 6,110,641 | A | * | 8/2000 | Trefonas et al. | 430/270.1 |
| 6,699,638 | B2 | * | 3/2004 | Kita | 430/273.1 |

FOREIGN PATENT DOCUMENTS

| JP | 08-334893 | 12/1996 |
| KR | 1996-011701 | 4/1996 |
| KR | 2005-0031253 | 4/2005 |

OTHER PUBLICATIONS

Methyl Cellosolve Acetate, NIOSH Manual of Analytical Methods (NMAM), Aug. 15, 1994.*

* cited by examiner

*Primary Examiner* — Cynthia H Kelly
*Assistant Examiner* — Anca Eoff
(74) *Attorney, Agent, or Firm* — Cantor Colburn LLP

(57) ABSTRACT

A photoresist composition comprises about 0.5 to about 20 parts by weight of a photo-acid generator, about 10 to about 70 parts by weight of a novolac resin containing a hydroxyl group, about 1 to about 40 parts by weight of a cross-linker that comprises an alkoxymethylmelamine compound, and about 10 to about 150 parts by weight of a solvent.

12 Claims, 2 Drawing Sheets

PHOTORESIST COMPOSITION AND METHOD OF FORMING A PHOTORESIST PATTERN USING THE SAME

CROSS-REFERENCE TO RELATED APPLICATIONS

This application claims priority to Korean Patent Application No. 10-2007-0032371, filed on Apr. 2, 2007, and all the benefits accruing therefrom under 35 U.S.C. §119, the contents of which in its entirety are herein incorporated by reference.

BACKGROUND OF THE INVENTION

1. Field of the Invention

Disclosed is a photoresist composition and a method of forming a photoresist pattern using the photoresist composition. Specifically, disclosed in an embodiment is a photoresist composition capable of preventing a reverse-tapered shape of a photoresist pattern and a method of forming a photoresist pattern using the photoresist composition.

2. Description of the Related Art

A liquid crystal display (LCD) apparatus displays an image using optical and electrical properties of liquid crystal, such as an anisotropic refractive index and an anisotropic dielectric constant. Desirable characteristics of an LCD apparatus include lighter weight, lower power consumption, and lower driving voltage in comparison with other types of displays, such as a cathode ray tube (CRT) or a plasma display panel (PDP).

Generally, the LCD apparatus includes an LCD panel and a light source providing the LCD panel with light. The LCD panel includes a plurality of pixels and a plurality of thin-film transistors (TFTs). The pixels and the TFTs are formed using a photolithography process that employs a photoresist composition.

The photoresist composition can be classified as either a positive photoresist composition or a negative photoresist composition. When a negative photoresist composition is used for forming a fine pattern, the light energy in an exposure process is preferably lowered to reduce interference with an adjacent pattern from light diffraction. However, when the light energy in the exposure process is lowered, a lower portion of a photoresist film is not provided with sufficient light energy. Thus, a photoresist pattern can have a reverse-tapered shape, wherein the width of an upper portion of the photoresist pattern is greater than that of a lower portion of the photoresist pattern.

The photoresist pattern having the reverse-tapered shape can be easily damaged by external pressure, for example, by an increase in pressure applied when being dried during a manufacturing process.

BRIEF SUMMARY OF THE INVENTION

Disclosed is a photoresist composition capable of preventing a photoresist pattern with a reverse-tapered shape. An embodiment also provides a method of forming a photoresist pattern using the above-mentioned photoresist composition.

In an embodiment, a photoresist composition comprises about 0.5 to about 20 parts by weight of a photo-acid generator; about 10 to about 70 parts by weight of a novolac resin containing a hydroxyl group; about 1 to about 40 parts by weight of a cross-linker, wherein the cross-linker is comprised of an alkoxymethylmelamine compound; and about 10 to about 150 parts by weight of a solvent. The photo-acid generator can include a first compound represented by the following Chemical Formula 1 and optionally a second compound represented by the following Chemical Formula 2.

<Chemical Formula 1>

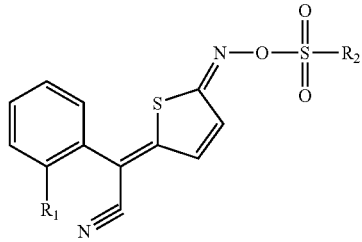

wherein $R_1$ and $R_2$ independently represent an alkyl group having 1 to 4 carbon atoms.

<Chemical Formula 2>

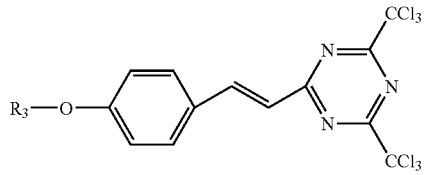

wherein $R_3$ represents an alkyl group having 1 to 4 carbon atoms.

Examples of the cross-linker can include hexamethoxymethylmelamine, or hexamethylolmelamine hexamethylether, and the like, or a combination of at least one of the foregoing compounds.

The photo-acid generator can further include a diazonium salt, an ammonium salt, an iodonium salt, a sulfonium salt, a phosphonium salt, an arsonium salt, an oxonium salt, a halogenated organic compound, a quinone diazide compound, a bis(sulfonyl)diazomethane compound, a sulfone compound, an organic acid-ester compound, an organic acid-amide compound, or an organic acid-imide compound, and the like, or a combination comprising at least one of the foregoing compounds. Furthermore, the cross-linker can include an alkoxymethylated amino resin, an alkyletherified melamine resin, a benzoguanamine resin, an alkyletherified benzoguanamine resin, a urea resin, an alkyletherified urea resin, a urethane-formaldehyde resin, a resol-type phenol formaldehyde resin, an alkyletherified resol-type phenol formaldehyde resin, or an epoxy resin, or the like, or a combination comprising at least one of the foregoing resins.

Examples the solvent can include glycol ether, ethylene glycol alkyl ether acetate, or diethylene glycol, or the like, or a combination comprising at least one of the foregoing solvents.

The photoresist composition can further include about 0.1 to about 10 parts by weight of an additive including, an adhesion promotion agent, a surfactant and optionally a photosensitizer. Examples of the photosensitizer can include tetrabutylammonium hydroxide, triethanolamine, diethanolamine, trioctylamine, n-octylamine, trimethylsulfonium hydroxide, or triphenylsulfonium hydroxide, or the like, or a combination comprising at least one of the foregoing photosensitizers.

As explained above, the photoresist composition can reduce the likelihood a photoresist pattern has a reverse-tapered shape. Thus, damage to the photoresist pattern can be prevented and reduced, and the resolution of the photoresist pattern improved.

BRIEF DESCRIPTION OF THE DRAWINGS

The above and other advantages of the embodiments of the invention will become readily apparent by reference to the following detailed description when considered in conjunction with the accompanying drawings wherein.

DETAILED DESCRIPTION OF THE INVENTION

Figure 1:
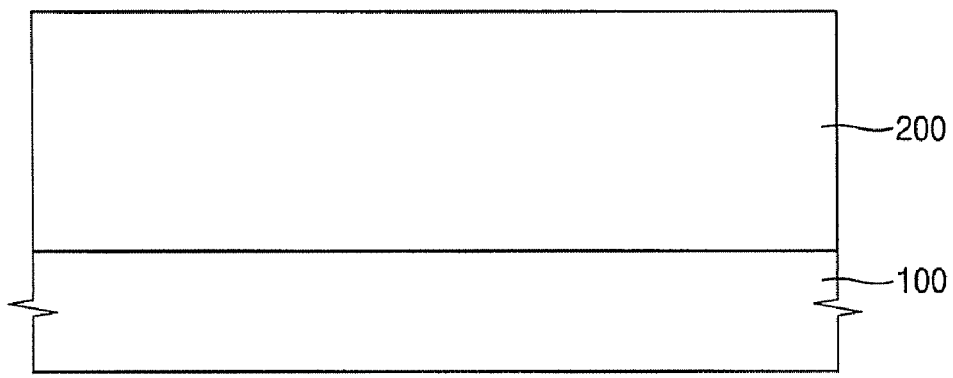
FIGS. 1, 2 and 3 are cross-sectional views illustrating an exemplary method of forming a photoresist pattern according to an embodiment of the present invention.

Described more fully hereinafter, with reference to the accompanying drawings, are embodiments of the invention. This invention can be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness, size and relative sizes of layers and regions are exaggerated for clarity.

It will be understood that when an element or layer is referred to as being "on" "connected to" or "coupled to" another element or layer, it can be directly on, connected or coupled to the other element or layer, or intervening elements or layers can be present therebetween. When an element is referred to as being "disposed on" or "formed on" another element, the elements are understood to be in at least partial contact with each other, unless otherwise specified. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms "first", "second", or "third", and the like do not imply any particular order, but can be used herein to describe various elements, components, regions, layers and/or sections. These elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," or "upper", and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated as a rectangle will, typically, have rounded or curved features. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Photoresist Composition

A photoresist composition according to an exemplary embodiment includes about 0.5 to about 20 parts by weight of a photo-acid generator; about 10 to about 70 parts by weight of a novolac resin containing a hydroxyl group; about 1 to about 40 parts by weight of a cross-linker, including an alkoxymethylmelamine compound; and about 10 to about 150 parts by weight of a solvent. The photo-acid generator can include a first compound represented by the following Chemical Formula 1 and/or a second compound represented by the following Chemical Formula 2:

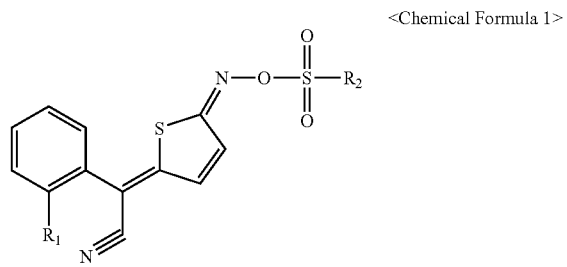

<Chemical Formula 1> wherein $R_1$ and $R_2$ independently represent an alkyl group having 1 to 4 carbon atoms; and <Chemical Formula 2>

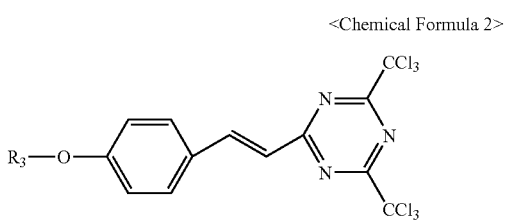

wherein R₃ represents an alkyl group having 1 to 4 carbon atoms.

The photo-acid generator can be illuminated with light to generate an acid, such as a Bronsted acid or Lewis acid. The first compound belongs to an onium compound, and the second compound belongs to a triazine compound. Unexpectedly, it has been discovered that the first compound can prevent and/or reduce a reverse-tapered shape of a photoresist pattern, and can improve the resolution of a photoresist pattern. Also unexpectedly, it has been discovered that the second compound can improve sensitivity of the resist to light and improve the remaining ratio of a photoresist pattern, where remaining ratio is a measure of pattern roughness due to shot noise.

Specifically, the photoresist composition can include both the first compound and the second compound. A weight ratio of the first compound to the second compound can be about 80:20 to about 20:80, specifically about 60:40 to about 40:60, more specifically 55:45 to 45:55.

The photo-acid generator can further include an onium compound different from the first compound. Examples of the onium compound include a diazonium salt, an ammonium salt, an iodonium salt such as diphenyliodonium triflate, a sulfonium salt such as triphenylsulfonium triflate, a phosphonium salt, an arsonium salt, an oxonium salt, or the like, or a combination of at least one of the foregoing compounds.

The photo-acid generator can further include a material capable of generating an acid upon light illumination, which is different from the onium salt. Examples of the material can include a halogenated organic compound, a quinone diazide compound, a bis(sulfonyl)diazomethane compound, a sulfone compound, an organic acid-ester compound, an organic acid-amide compound, an organic acid-imide compound, or the like, or a combination of at least one of the foregoing compounds.

Examples of the halogenated organic compound can include a halogen-containing oxadiazole compound, a halogen-containing triazine compound, a halogen-containing triazine compound, a halogen-containing acetophenone compound, a halogen-containing benzophenone compound, a halogen-containing sulfoxide compound, a halogen-containing sulfonic compound, a halogen-containing thiazole compound, a halogen-containing oxazole compound, a halogen-containing triazole compound, a halogen-containing 2-pyrone compound, a halogen-containing heterocyclic compound, a halogen-containing aliphatic hydrocarbon, a halogen-containing aromatic hydrocarbon, a sulfonyl halide compound, or the like, or a combination of at least one of the foregoing halogenated organic compounds.

Specifically, examples of the halogenated organic compound can include tris(2,3-dibromopropyl)phosphate, tris(2,3-dibromo-3-chloropropyl)phosphate, tetrabromochlorobutane, 2-[2-(3,4-dimethoxyphenyl)ethenyl]-4,6-bis(trichloromethyl)-S-triazine, hexachlorobenzene, hexabromobenzene, hexabromocyclododecane, hexabromocyclododecene, hexabromobiphenyl, allyltribromophenylether, tetrachlorobisphenol A, tetrabromobisphenol A, bis(chloroethyl)ether of tetrachlorobisphenol A, tetrachlorobisphenol S, tetrabromobisphenol S, bis(2,3-dichloropropyl)ether of tetrachlorobisphenol A, bis(2,3-dibromopropyl)ether of tetrabromobisphenol A, bis(chloroethyl)ether of tetrachlorobisphenol S, bis(bromoethyl)ether of tetrabromobisphenol S, bis(2,3-dichloropropyl)ether of bisphenol S, bis(2,3-dibromopropyl)ether of bisphenol S, tris(2,3-dibromopropyl)isocyanurate, 2,2-bis(4-hydroxy-3,5-dibromophenyl)propane, 2,2-bis(4-(2-hydroxyethoxy)-3,5-dibromophenyl)propane, dichlorodiphenyltrichloroethane, pentachlorophenol, 2,4,6-trichlorophenyl-4-nitrophenylether, 4,5,6,7-tetrachlorophthalide, 1,1-bis(4-chlorophenyl)ethanol, 1,1-bis(4-chlorophenyl)-2,2,2-trichloroethanol, 2,4,4',5-tetrachlorodiphenylsulfide, 2,4,4',5-tetrachlorodiphenylsulfone, or the like, or a combination of at least one of the foregoing halogenated organic compounds. Examples of the quinone diazide compound can include a sulfonic acid ester of a quinone diazide derivative such as 1,2-benzoquinonediazide-4-sulfonic acid ester, 1,2-naphthoquinonediazide-4-sulfonic acid ester; a sulfonic acid chloride of a quinone diazide derivative such as 1,2-benzoquinone-2-diazide-4-sulfonic acid chloride, 1,2-naphthoquinone-2-diazide-4-sulfonic acid chloride, 1,2-naphthoquinone-2-diazide-5-sulfonic acid chloride, 1,2-naphthoquinone-1-diazide-6-sulfonic acid chloride, 1,2-benzoquinone-1-diazide-5-sulfonic acid chloride, or the like, or a combination of at least one of the foregoing quinone diazide compounds. Examples of the bis(sulfonyl)diazomethane compound can include α,α'-bis(sulfonyl)diazomethane containing an alkyl group, an alkenyl group, an aralkyl group, an aromatic group or a heterocyclic group, which can be symmetrically substituted, non-symmetrically substituted, or not substituted, or the like, or a combination of at least one of the foregoing bis(sulfonyl)diazomethane compounds. Examples of the sulfone compound can include a sulfone compound and a disulfone compound, which comprises an alkyl group, an alkenyl group, an aralkyl group, an aromatic group or a heterocyclic group, which can be symmetrically substituted, non-symmetrically substituted, or not substituted, or the like, or a combination of at least one of the foregoing sulfone compounds.

Examples of the organic acid ester can include carboxylic acid ester, sulfonic acid ester, or phosphoric acid ester, and the like, or a combination of at least one of the foregoing acid esters. Examples of the organic acid amide can include carboxylic acid amide, sulfonic acid amide, phosphoric acid amide, or the like, or a combination of at least one of the foregoing acid amides.

Moreover, examples of the photo-acid generator can further include cyclohexylmethyl(2-oxocyclohexyl)sulfonium trifluoromethane sulfonate, dicyclohexylmethyl(2-oxocyclohexyl)sulfonium trifluoromethane sulfonate, 2-oxocyclohexyl(2-norbornyl)sulfonium trifluoromethane sulfonate, 2-cyclohexylsulfonylcyclohexanone, dimethyl(2-oxocyclohexyl)sulfonium trifluoromethane sulfonate, triphenylsulfonium trifluoromethane sulfonate, diphenyliodonium trifluoromethane sulfonate, N-hydroxysuccinimidyl trifluoromethane sulfonate, phenyl p-toluene sulfonate, α-carbonyl-α-sulfonyldiazomethane containing an alkyl group, an alkenyl group, an aralkyl group, an aromatic group or a heterocyclic group, which can be symmetrically substituted, non-symmetrically substituted, or not substituted, or the like, or a combination of at least one of the foregoing compounds. When the concentration of the photo-acid generator is too small, a photoresist pattern formed from the photoresist composition can have poor resolution since the amount of an acid generated by light exposure is insufficient.

When the concentration of the photo-acid generator is too great, a photoresist pattern formed from the photoresist composition can have a rounded edge, or can be damaged in the course of a development process.

The novolac resin is soluble in an alkali solution. A commercially available novolac resin used in a photolithography can be used as the novolac resin of the photoresist composition according to an exemplary embodiment. Specifically, the novolac resin can be prepared by reacting a phenol compound with an aldehyde compound or a ketone compound in the presence of an acidic catalyst.

Examples of the phenol compound can include phenol, o-cresol, m-cresol, p-cresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, isothymol, or the like, or a combination of at least one of the foregoing compounds.

Examples of the aldehyde compound can include formaldehyde, formalin, p-formaldehyde, trioxane, acetaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde, terephthalic acid aldehyde, or the like, or a combination of at least one of the foregoing compounds. Examples of the ketone compound can include acetone, methylethylketone, diethylketone, diphenylketone, or the like, or a combination of at least one of the foregoing compounds. Specifically, the novolac resin can be prepared by reacting the aldehyde compound with a mixture of m-cresol and p-cresol to control the sensitivity of the photoresist composition. For example, a mixture of m-cresol and p-cresol can be reacted with salicylic aldehyde to prepare a novolac resin having relatively high heat resistance. Alternatively, a mixture of m-cresol and p-cresol can be reacted with formaldehyde, formalin, p-formaldehyde, or the like, or a combination of at least one of the foregoing compounds, to prepare a novolac resin having relatively low heat resistance. A weight ratio of m-cresol to p-cresol can be about 80:20 to about 20:80, specifically about 70:30 to about 30:70, and more specifically about 50:50.

A polystyrene-reduced weight-average molecular weight of the novolac resin, measured by gel permeation chromatography (GPC), can be about 1,000 Daltons to about 10,000 Daltons, specifically about 3,000 Daltons to about 9,000 Daltons, more specifically 5,000 Daltons to 7,000 Daltons. Unexpectedly, it has been discovered that when the molecular weight of the novolac resin is too small, a photoresist pattern formed from the photoresist composition can be damaged by an alkali developing solution. Unexpectedly, it has been discovered that when the molecular weight of the novolac resin is too great, the photoresist pattern can have poor resolution since the solubility difference between an exposed portion and an unexposed portion is small.

The cross-linker is activated by the acid generated by the photo-acid generator, and combines with the novolac resin. Thus, the novolac resin is cross-linked.

Specifically, the alkoxymethylmelamine compound can include hexamethoxymethylmelamine represented by the following Chemical Formula 3 and/or hexamethylolmelamine hexamethylether represented by the following Chemical Formula 4.

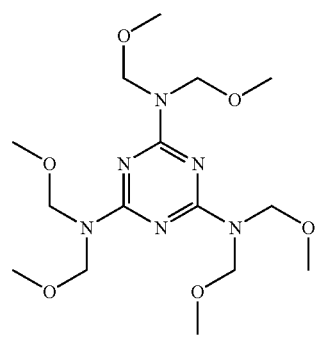

<Chemical Formula 3>

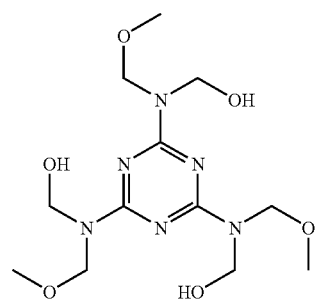

<Chemical Formula 4>

Hexamethoxymethylmelamine can increase the sensitivity of a photoresist pattern, and hexamethylolmelamine hexamethylether can reduce a photoresist pattern having a reverse-tapered shape.

Specifically, the cross-linker can include both hexamethoxymethylmelamine and hexamethylolmelamine hexamethylether. A weight ratio of the hexamethoxymethylmelamine to the hexamethylolmelamine hexamethylether can be about 80:20 to about 20:80, specifically about 70:30 to about 30:70, more specifically about 60:40 to 40:60. When the proportion of the hexamethoxymethylmelamine is too great, a photoresist pattern formed from the photoresist composition can have a reverse-tapered shape. Unexpectedly, it has been discovered that when the proportion of the hexamethylolmelamine hexamethylether is too great, the velocity of the cross-linking reaction is reduced so that the sensitivity and remaining ratio of the photoresist pattern are reduced.

The cross-linker can further include a different material capable of serving as a cross-linker. Examples of the cross-linker can include an alkoxymethylated amino resin, such as an alkoxymethylated urea resin, an alkoxymethylated uron resin, an alkoxymethylated glycol uryl resin. Furthermore, examples of the cross-linker can further include an alkyletherified melamine resin, a benzoguanamine resin, an alkyletherified benzoguanamine resin, a urea resin, an alkyletherified urea resin, a urethane-formaldehyde resin, a resol-type phenol formaldehyde resin, an alkyletherified resol-type phenol formaldehyde resin, an epoxy resin, or the like, or a combination of at least one of the foregoing resins. Specifically, a methoxymethylated amino resin, a methoxyethylated amino resin, an n-butoxymethylated amino resin, or the like, or a combination of at least one of the foregoing resins can be used.

When the concentration of the cross-linker is too small, the degree of cross-linking can be insufficient. Unexpectedly, it has been discovered that in this case, the remaining ratio of a photoresist pattern can be reduced, or the photoresist pattern can be easily deformed. Also, unexpectedly, it has been discovered that when the content of the cross-linker is too great, the resolution of the photoresist pattern can be reduced, or adhesion between the photoresist and a substrate is deteriorated.

The weight ratio of the photo-acid generator to the cross-linker can be about 1:1 to about 1:40, specifically about 1:2 to about 1:20, more specifically about 1:3 to about 1:10, in view of resolution, heat resistance and an adhesion with a substrate.

Examples of the solvent include alcohols such as methanol and ethanol; ethers such as tetrahydrofurane; glycol ethers such as ethylene glycol monomethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol monoethyl ether and diethylene glycol dimethyl ether; propylene glycol monoalkyl ethers such as propylene glycol methyl ether, propylene glycol ethyl ether, propylene glycol propyl ether and propylene glycol butyl ether; propylene glycol alkyl ether acetates such as propylene glycol methyl ether acetate, propylene glycol ethyl ether acetate, propylene glycol propyl ether acetate and propylene glycol butyl ether acetate; propylene glycol alkyl ether propionates such as propylene glycol methyl ether propionate, propylene glycol ethyl ether propionate, propylene glycol propyl ether propionate and propylene glycol butyl ether propionate; aromatic compounds such as toluene and xylene; ketones such as methyl ethyl ketone, cyclohexanone and 4-hydroxy-4-methyl-2-pentanone; and ester compounds such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, or the like, or a combination of at least one of the foregoing alcohols. Among the above examples, glycol ethers, ethylene glycol alkyl ether acetates and diethylene glycols are specifically used in view of the solubility and reactivity of each of the components comprising the photoresist composition and manufacturing a coating layer.

The photoresist composition can further include an additive such as an adhesion promotion agent, a surfactant, or a photosensitizer, and the like, or a combination of at least one of the foregoing additives. In an exemplary embodiment, the content of the additive can be about 0.1 to about 10 parts by weight.

The adhesion promotion agent can improve adhesion between the substrate and a photoresist pattern formed from the photoresist composition. Examples of the adhesion promotion agents can include a silane coupling agent containing a reactive substitution group such as a carboxyl group, a methacrylic group, an isocyanate group, or an epoxy group. Specifically, examples of the silane coupling agent can include γ-methacryloxypropyl trimethoxy silane, vinyl triacetoxy silane, vinyl trimethoxy silane, γ-isocyanate propyl triethoxy silane, γ-glycidoxy propyl trimethoxy silane, β-(3, 4-epoxy cyclohexyl)ethyl trimethoxy silane, or the like, or a combination of at least one of the foregoing silane compounds.

A surfactant can improve coating characteristics and development characteristics of the photoresist composition. Examples of the surfactant can include polyoxyethylene octylphenylether, polyoxyethylene, and nonylphenylether; surfactants marketed under the trade names F171, F172, and F173 by Dainippon Ink in Japan; surfactants marketed under the trade names FC430 and FC431 by Sumitomo 3M in Japan; or surfactants marketed under the trade name KP341 by Shin-Etsu Chemical in Japan, and the like, or a combination of at least one of the foregoing surfactants.

The photosensitizer can convert energy of a specific wavelength to a different wavelength. Examples of the photosensitizer can include an amine, ammonium hydroxide, a photosensitive base, or the like, or a combination of at least one of the foregoing photosensitizers. Specifically, examples of photosensitizer can include tetrabutylammonium hydroxide, triethanolamine, diethanolamine, trioctylamine, n-octylamine, trimethylsulfonium hydroxide, or triphenylsulfonium hydroxide, and the like, or a combination of at least one of the foregoing photosensitizers.

Hereinafter, a method of forming a photoresist pattern, according to exemplary embodiments of the invention, will be described more fully with reference to the accompanying drawings.

Method of Forming a Photoresist Pattern

Figure 2:
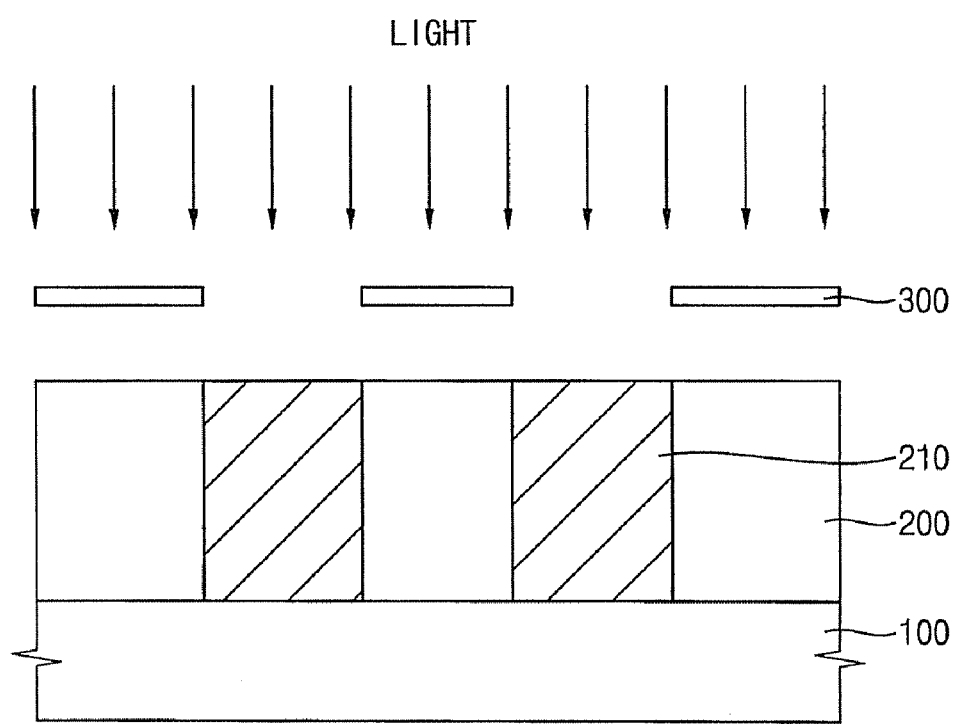
Figure 3:
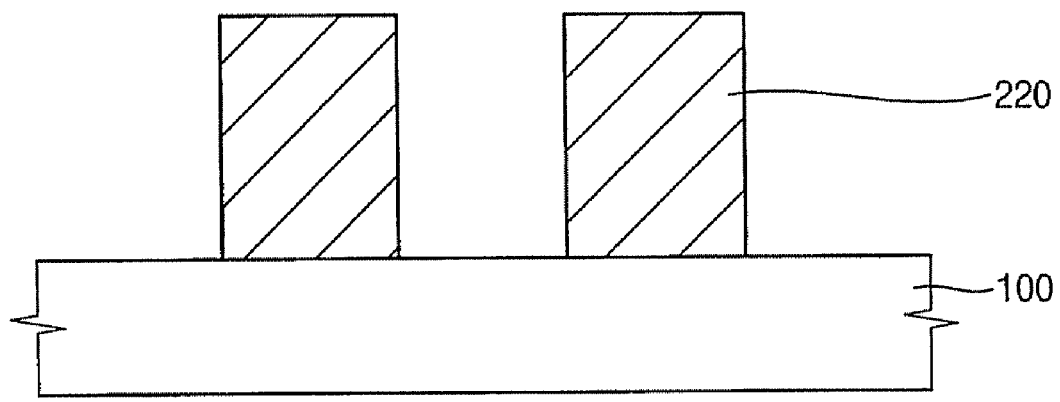

FIGS. 1, 2 and 3 are cross-sectional views illustrating a method of forming a photoresist pattern according to an exemplary embodiment FIG. 1 is a cross-sectional view illustrating forming photoresist film 200 on a substrate 100.

Referring to FIG. 1, substrate 100 can be a silicon wafer, for example. The present exemplary embodiment will be described with respect to the substrate 100. A surface treatment process can be selectively performed on substrate 100 to remove moisture and/or any contaminants on substrate 100. Moisture and/or contaminants on substrate 100 can deteriorate the adhesive characteristics of photoresist film 200. In the surface treatment process, substrate 100 can be fixed to a chuck, and then a fabric brush can make contact with the substrate 100 while it rotates at a high speed, thereby rapidly cleaning substrate 100. Thus, moisture and/or contaminants can be removed from substrate 100 in the surface treatment process.

The photoresist film 200 can be formed on substrate 100 by coating a photoresist composition, including about 0.5 to about 20 parts by weight of a photo-acid generator, about 10 to about 70 parts by weight of a novolac resin containing a hydroxyl group, about 1 to about 40 parts by weight of a cross-linker including an alkoxymethylmelamine compound, and about 10 to about 150 parts by weight of a solvent. The photo-acid generator can include a first compound, represented by the following Chemical Formula 1, wherein $R_1$ and $R_2$ independently represent an alkyl group having 1 to 4 carbon atoms,

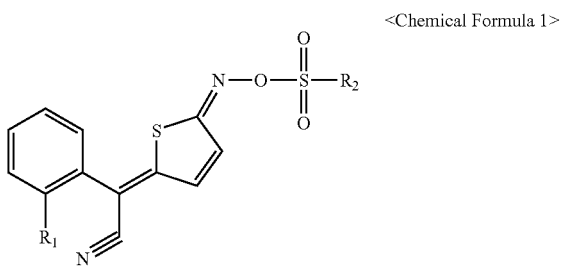
<Chemical Formula 1> and/or a second compound represented by the following Chemical Formula 2,

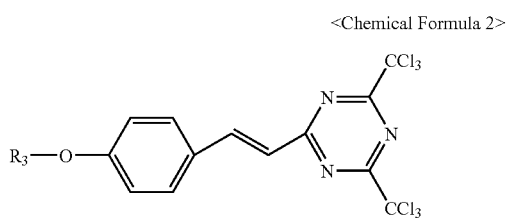
<Chemical Formula 2> wherein $R_3$ represents an alkyl group having 1 to 4 carbon atoms. The photoresist film 200 can be formed using a spin-coating method, a spraying method, or a roll coater method, and the like, or a combination of at least one of the foregoing methods.

In an embodiment, the photoresist composition can be substantially the same as the previously described photoresist composition. A first baking process can be performed on the substrate 100 with the photoresist film 200 disposed thereon. The first baking process can be performed at a temperature of about 70° C. to about 130° C., specifically 80° C. to 120° C., more specifically 90° C. to 110° C. The first baking process can enhance adhesive characteristics between photoresist film 200 and substrate 100.

FIG. 2 is a cross-sectional view illustrating exposing photoresist film 200

Referring to FIG. 2, substrate 100 is exposed to light. Specifically, a mask 300, on which a selected pattern can be formed, is positioned on a mask stage of an exposure apparatus. The mask 300 can be arranged over the substrate 100, wherein the photoresist film 200 is disposed on substrate 100, in an alignment process so photoresist film 200 is disposed between substrate 100 and mask 300. An illumination light is irradiated onto mask 300 for a selected time so that a portion of the photoresist film 200 is selectively reacted with light through mask 300. Examples of the light can include that produced by a mercury-xenon (Hg—Xe) lamp, a krypton fluoride laser, or an argon fluoride laser; light of the type G-line ray, I-line ray, an electron beam, or X-ray, and the like, or a combination of at least one of the foregoing lights. An exposed portion 210 of the photoresist film 200 can have solubility different from that of an unexposed portion of the photoresist film 200.

After the exposing process, a second baking process can be additionally performed on substrate 100. The second baking process can be performed at a temperature of about 70° C. to about 160° C., specifically 80° C. to 150° C., more specifically 90° C. to 130° C. In the second baking process, the solubility of the exposed portion 210 can be further changed so that the exposed portion 210 can be easily dissolved in a particular solvent.

FIG. 3 is a cross-sectional view illustrating developing the exposed photoresist film 200.

Referring to FIG. 3, the exposed portion 210 is removed using a developing solution to form the photoresist pattern 220 on the substrate 100. For example, the exposed portion 210 can be removed using an alkali solution such as a potassium hydroxide solution, and the like.

The substrate 100, including the photoresist pattern 220 disposed thereon, can be cleaned, and then other ordinary processes can be performed. Various structures of a device, such as a liquid crystal display device or a semiconductor device, can be formed using the photoresist pattern 220 as a mask.

The photoresist composition and the method of forming a photoresist pattern, according to exemplary embodiments, will be further described hereinafter through Examples and Comparative Examples.

Example 1

A phenol mixture, including m-cresol and p-cresol in a weight ratio of about 40:60, was reacted with formaldehyde to prepare an alkali-soluble novolac resin, with weight-average molecular weight about 4,000 Daltons. About 100 parts by weight of the alkali-soluble novolac resin, about 2 parts by weight of a compound represented by the following Chemical Formula 5 as a photo-acid generator, about 5 parts by weight of hexamethylolmelamine hexamethylether as a cross-linker, about 0.6 parts by weight of UV yellow 1549 as an azo-based dye, about 1 parts by weight of trioctylamine, and about 400 parts by weight of propyleneglycol methylether propionate as a solvent, were mixed with each other to prepare a photoresist composition.

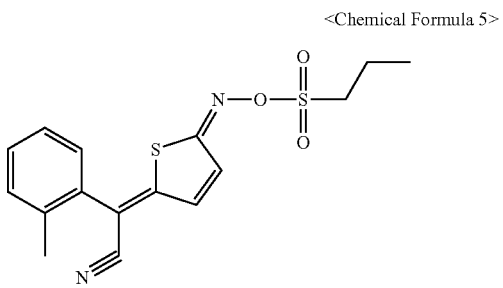
<Chemical Formula 5>

The photoresist composition was coated on a substrate to form a photoresist film. The photoresist film was exposed to light, baked and then developed to form a photoresist pattern. Sensitivity of the exposure process was about 140 mJ. The temperature of a hot plate used in a baking process was about 130° C. A critical dimension of the photoresist pattern was about 2 μm. A thickness of the photoresist pattern was about 1.5 μm.

Example 2

A photoresist composition was prepared through substantially the same method as Example 1, except that the photoresist composition included about 0.4 parts by weight of the compound represented by Chemical Formula 5 of Example 1 and about 1.6 parts by weight of a compound represented by the following Chemical Formula 6, as a photo-acid generator:

<Chemical Formula 6>

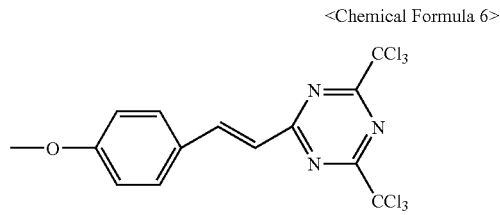

The photoresist composition was coated on a substrate to form a photoresist film. The photoresist film was exposed to light, baked, and then developed to form a photoresist pattern. The sensitivity of the exposure process was about 30 mJ. The temperature of a hot plate used in a baking process was about 130° C. A critical dimension of the photoresist pattern was about 2 µm. A thickness of the photoresist pattern was about 1.5 µm.

Example 3

A photoresist composition was prepared through substantially the same method as Example 1 except that the photoresist composition included about 2 parts by weight of hexamethoxymethylmelamine and about 3 parts by weight of hexamethylolmelamine hexamethylether, as a cross-linker.

The photoresist composition was coated on a substrate to form a photoresist film. The photoresist film was exposed to light, baked, and then developed to form a photoresist pattern. The sensitivity of the exposure process was about 30 mJ. The temperature of a hot plate used in a baking process was about 130° C. A critical dimension of the photoresist pattern was about 2 µm. A thickness of the photoresist pattern was about 1.5 µm.

Example 4

A photoresist composition was prepared through substantially the same method as Example 1, except that the photoresist composition included about 0.4 parts by weight of the compound represented by Chemical Formula 5 of Example 1 and about 1.6 parts by weight of the compound represented by Chemical Formula 6 of Example 2, as a photo-acid generator, and about 2 parts by weight of hexamethoxymethylmelamine and about 3 parts by weight of hexamethylolmelamine hexamethylether, as a cross-linker.

The photoresist composition was coated on a substrate to form a photoresist film. The photoresist film was exposed to light, baked, and then developed to form a photoresist pattern. The sensitivity of an exposure process was about 30 mJ. The temperature of a hot plate used in a baking process was about 130° C. A critical dimension of the photoresist pattern was about 2 µm. A thickness of the photoresist pattern was about 1.5 µm.

Example 5

A photoresist composition was prepared through substantially the same method as Example 1 except that the photoresist composition included about 2 parts by weight of the compound represented by Chemical Formula 6 of Example 2 as a photo-acid generator, and about 5 parts by weight of hexamethoxymethylmelamine as a cross-linker.

The photoresist composition was coated on a substrate to form a photoresist film. The photoresist film was exposed to light, baked and then developed to form a photoresist pattern. The sensitivity of the exposure process was about 25 mJ. The temperature of a hot plate used in a baking process was about 130° C. A critical dimension of the photoresist pattern was about 2 µm. A thickness of the photoresist pattern was about 1.5 µm.

A tapered angle and a resolution of each of the photoresist patterns of Examples 1 to 5 were measured, and adhesion characteristics between the substrate and each of the photoresist patterns were evaluated. In order to evaluate the adhesion characteristics, lifting of each of the photoresist patterns were observed, and the photoresist patterns were divided into three levels of "good," "normal" and "bad." The results are reported in the following Table 1.

TABLE 1

| | Tapered Angle (°) | Resolution (µm) | Adhesion Characteristics |
|---|---|---|---|
| Example 1 | — | — | Normal |
| Example 2 | 107 | Less than 2.0 | Good |
| Example 3 | 111 | Less than 2.0 | Good |
| Example 4 | 97 | Less than 2.0 | Good |
| Example 5 | 123 | Less than 2.0 | Bad |

Referring to Table 1, the photoresist pattern of Example 1 did not have a clear shape so that a tapered angle and a resolution were not measured. The photoresist pattern of Example 5 had a tapered angle of 123 degrees, and a portion of the photoresist pattern was lifted and damaged in the course of the developing process. However, the photoresist patterns of Examples 2 to 4 had tapered angle of 97 to 111 degrees. Thus, it can be noted that a reverse-tapered extent of each of the photoresist pattern of Examples 2 to 4 was reduced, and unexpectedly, the adhesion characteristics of the photoresist patterns was improved.

Thus, it can be noted that a photoresist composition including both the compound represented by Chemical Formula 5 of Example 1 and the compound represented by Chemical Formula 6 of Example 2, as a photo-acid generator, and hexamethoxymethylmelamine and hexamethylolmelamine hexamethylether, as a cross-linker, is desired in order to improve a reverse-tapered shape of a photoresist pattern.

Example 6

A phenol mixture, including m-cresol and p-cresol in a weight ratio of about 40:60, was reacted with formaldehyde to prepare an alkali-soluble novolac resin with a weight-average molecular weight of about 4,000 Daltons. About 100 parts by weight of the alkali-soluble novolac resin, about 1 parts by weight of the compound represented by Chemical Formula 5 of Example 1, about 1 parts by weight of the compound represented by Chemical Formula 6 of Example 2 (as a photo-acid generator), about 5 parts by weight of hexamethoxymethylmelamine as a cross-linker, about 0.6 parts by weight of UV yellow 1549 as an azo-based dye, about 1 parts by weight of trioctylamine, and about 400 parts by weight of propyleneglycol methylether propionate as a solvent, were mixed with each other to prepare a photoresist composition.

The photoresist composition was coated on a substrate to form a photoresist film. The photoresist film was exposed to light, baked and then developed to form a photoresist pattern. The sensitivity of an exposure process was about 30 mJ. The temperature of a hot plate used in a baking process was about 130° C. A critical dimension of the photoresist pattern was about 2 μm. A thickness of the photoresist pattern was about 1.5 μm.

Example 7

A photoresist composition and a photoresist pattern were prepared through substantially the same method as Example 6, except that the photoresist composition included about 1.5 parts by weight of the compound represented by Chemical Formula 5 of Example 1, and about 0.5 parts by weight of the compound represented by Chemical Formula 6 of Example 2, as a photo-acid generator.

Example 8

A photoresist composition and a photoresist pattern were prepared through substantially the same method as Example 6, except that the photoresist composition included about 2 parts by weight of the compound represented by Chemical Formula 5 of Example 1 as a photo-acid generator.

Example 9

A photoresist composition and a photoresist pattern were prepared through substantially the same method as Example 6, except that the photoresist composition included about 2 parts by weight of the compound represented by Chemical Formula 6 of Example 2, as a photo-acid generator, and about 4 parts by weight of hexamethoxymethylmelamine and about 1 parts by weight of hexamethylolmelamine hexamethylether, as a cross-linker.

Example 10

A photoresist composition and a photoresist pattern were prepared through substantially the same method as Example 8, except that the photoresist composition included about 2.5 parts by weight of hexamethoxymethylmelamine and about 2.5 parts by weight of hexamethylolmelamine hexamethylether, as a cross-linker.

Example 11

A photoresist composition and a photoresist pattern were prepared through substantially the same method as Example 6, except that the photoresist composition included about 2 parts by weight of the compound represented by Chemical Formula 6 of Example 2, as a photo-acid generator, and about 5 parts by weight of hexamethoxymethylmelamine, as a cross-linker.

A reverse-tapered index of each of the photoresist patterns of Examples 6 to 11 was determined, and the obtained results are reported in the following Table 2. The reverse-tapered index was determined as the difference between a critical dimension at the upper end of the photoresist pattern and the same critical dimension at a lower end of the photoresist pattern.

TABLE 2

| Example | Reverse-tapered Index (μm) |
|---|---|
| Example 6 | 0.40 |
| Example 7 | 0.36 |

TABLE 2-continued

| Example | Reverse-tapered Index (μm) |
|---|---|
| Example 8 | 0.26 |
| Example 9 | 0.37 |
| Example 10 | 0.26 |
| Example 11 | 0.39 |

Referring to Table 2, it can be noted that a reverse-tapered shape of a photoresist pattern can be improved by a proper combination of a photo-acid generator and a cross-linker. Specifically, it can be noted that a photoresist composition including both the compound represented by Chemical Formula 5 of Example 1, and the compound represented by Chemical Formula 6 of Example 2, as a photo-acid generator, and hexamethoxymethylmelamine and hexamethylolmelamine hexamethylether, as a cross-linker, is preferable in order to improve a reverse-tapered shape of a photoresist pattern.

According to the above, a photoresist composition, according to an exemplary embodiment, can reduce a reverse-tapered shape of photoresist pattern. Thus, damage to the photoresist pattern can be prevented and/or reduced, and resolution of the photoresist pattern can be improved.

Although exemplary embodiments of the invention have been described, it is understood that the invention should not be limited to these exemplary embodiments but various changes and modifications can be made by one ordinary skilled in the art without departing from the spirit and scope of the invention as hereinafter claimed. In addition, many modifications can be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:
1. A photoresist composition comprising:
about 0.5 to about 20 parts by weight of a photo-acid generator, the photoacid generator comprising a first compound represented by the following Chemical Formula 1 and a second compound represented by the following Chemical Formula 2;
about 10 to about 70 parts by weight of a novolac resin containing a hydroxyl group;
about 1 to about 40 parts by weight of a cross-linker, the cross-linker comprising hexamethoxymethylmelamine and hexamethylolmelamine hexamethylether; and
about 10 to about 150 parts by weight of a solvent.

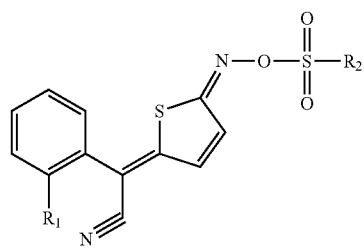

<Chemical Formula 1>

-continued

<Chemical Formula 2>

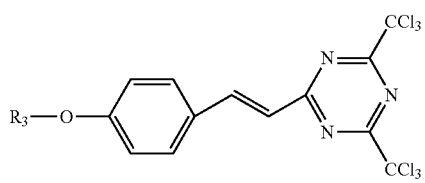

wherein R₁, R₂ and R₃ independently represent an alkyl group having 1 to 4 carbon atoms.

2. The photoresist composition of claim 1, wherein the photo-acid generator further comprises a diazonium salt, an ammonium salt, an iodonium salt, a sulfonium salt, a phosphonium salt, an arsonium salt, an oxonium salt, a halogenated organic compound, a quinone diazide compound, a bis(sulfonyl)diazomethane compound, a sulfone compound, an organic acid-ester compound, an organic acid-amide compound an organic acid-imide compound, or a combination of at least one of the foregoing compounds.

3. The photoresist composition of claim 1, wherein the cross-linker further comprises an alkoxymethylated amino resin, an alkyletherified melamine resin, a benzoguanamine resin, an alkyletherified benzoguanamine resin, a urea resin, an alkyletherified urea resin, a urethane-formaldehyde resin, a resol-type phenol formaldehyde resin, an alkyletherified resol-type phenol formaldehyde resin, an epoxy resin, or a combination comprising at least one of the foregoing resins.

4. The photoresist composition of claim 1, wherein the solvent is glycol ether, ethylene glycol alkyl ether acetates a diethylene glycol, or a combination of at least one of the foregoing solvents.

5. The photoresist composition of claim 1, further comprising about 0.1 to about 10 parts by weight of an additive comprising an adhesion promotion agent, a surfactant a photosensitizer, or a combination of at least one of the foregoing additives.

6. The photoresist composition of claim 5, wherein the photosensitizer is tetrabutylammonium hydroxide, triethanolamine, diethanolamine, trioctylamine, n-octylamine, trimethylsulfonium hydroxide triphenylsulfonium hydroxide, or a combination of at least one of the foregoing photosensitizers.

7. The photoresist composition of claim 1, wherein the photoacid generator is represented by Chemical Formula 5 and Chemical Formula 6

<Chemical Formula 5>

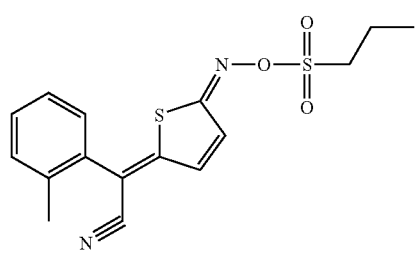

-continued

<Chemical Formula 6>

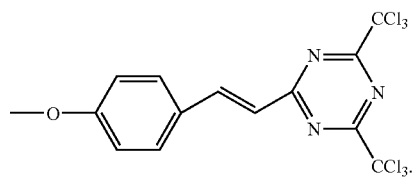

8. A method of forming a photoresist pattern, the method comprising:

coating a photoresist composition on a substrate to form a photoresist film, the photoresist composition comprising: about 0.5 to about 20 parts by weight of a photo-acid generator, the photo-acid generator comprising a first compound represented by the following Chemical Formula 1:

<Chemical Formula 1>

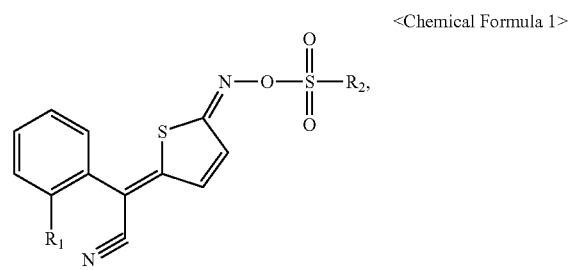

and a second compound represented by the following Chemical Formula 2:

<Chemical Formula 2>

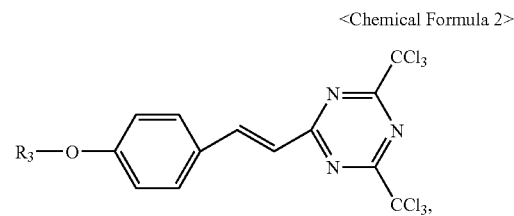

wherein R₁, R₂ and R₃ independently represent an alkyl group having 1 to 4 carbon atoms;

about 10 to about 70 parts by weight of a novolac resin containing a hydroxyl group; about 1 to about 40 parts by weight of a cross-linker including hexamethoxymethylmelamine and hexamethylolmelamine hexamethylether; and about 10 to about 150 parts by weight of a solvent;

exposing the photoresist film to light; and removing a portion of the photoresist film to form a photoresist pattern.

9. The method of claim 8, wherein the photoresist composition further comprises about 0.1 to about 10 parts by weight of an additive comprising an adhesion promotion agent, a surfactant or a photosensitizer, or a combination of at least one of the foregoing additives.

10. The method of claim 8, wherein the photoresist film is exposed to light emanating from a mercury-xenon (Hg—Xe)

lamp, a krypton fluoride laser, or an argon fluoride laser; or electron beam, X-ray, G-line ray, I-line ray light, or a combination of one of the foregoing lights.

11. The method of claim 8, further comprising baking the photoresist film at a temperature of about 70° C. to about 130° C. before exposing the photoresist film to light.

12. The method of claim 8, further comprising baking the photoresist film at a temperature of about 70° C. to about 160° C. after exposing the photoresist film to light.

* * * * *